United States Patent
Hoshino et al.

(10) Patent No.: US 9,418,940 B2
(45) Date of Patent: Aug. 16, 2016

(54) STRUCTURES AND METHODS FOR STACK TYPE SEMICONDUCTOR PACKAGING

(75) Inventors: Masataka Hoshino, Tokyo (JP); Masahiko Harayama, Tokyo (JP); Koji Taya, Kanagawa (JP); Naomi Masuda, Kanagawa (JP); Masanori Onodera, Kanagawa (JP); Ryota Fukuyama, Tokyo (JP)

(73) Assignee: Cypress Semiconductor Corporation, San Jose, CA (US)

( * ) Notice: Subject to any disclaimer, the term of this patent is extended or adjusted under 35 U.S.C. 154(b) by 177 days.

(21) Appl. No.: 12/110,181

(22) Filed: Apr. 25, 2008

(65) Prior Publication Data

US 2009/0115044 A1    May 7, 2009

(30) Foreign Application Priority Data

Apr. 26, 2007   (JP) .................. 2007-116289

(51) Int. Cl.
| | |
|---|---|
| *H01L 23/02* | (2006.01) |
| *H01L 23/538* | (2006.01) |
| *H01L 25/10* | (2006.01) |
| *H01L 25/00* | (2006.01) |
| *H01L 23/31* | (2006.01) |
| *H01L 23/00* | (2006.01) |

(52) U.S. Cl.
CPC .......... *H01L 23/5389* (2013.01); *H01L 25/105* (2013.01); *H01L 25/50* (2013.01); *H01L 23/3128* (2013.01); *H01L 24/48* (2013.01); *H01L 24/73* (2013.01); *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2225/1023* (2013.01); *H01L 2225/1058* (2013.01); *H01L 2924/01079* (2013.01); *H01L 2924/15311* (2013.01); *H01L 2924/15331* (2013.01); *H01L 2924/1815* (2013.01)

(58) Field of Classification Search
CPC .................... H01L 2924/1532; H01L 23/5389
USPC ......................................................... 257/686
See application file for complete search history.

(56) References Cited

U.S. PATENT DOCUMENTS

| | | | | |
|---|---|---|---|---|
| 6,646,335 | B2 * | 11/2003 | Emoto ........................... | 257/686 |
| 6,734,542 | B2 * | 5/2004 | Nakatani et al. .............. | 257/687 |
| 7,125,798 | B2 * | 10/2006 | Sakamoto et al. ............ | 438/666 |
| 7,548,430 | B1 * | 6/2009 | Huemoeller et al. ......... | 361/760 |
| 2005/0006739 | A1 * | 1/2005 | Howard et al. ............... | 257/678 |
| 2005/0067688 | A1 * | 3/2005 | Humpston .................... | 257/704 |
| 2006/0121718 | A1 * | 6/2006 | Machida et al. .............. | 438/612 |

FOREIGN PATENT DOCUMENTS

| | | |
|---|---|---|
| JP | 9148494 | 6/1997 |
| JP | 2003-023133 | 6/2001 |

(Continued)

*Primary Examiner* — Ajay K Arora (57) ABSTRACT

Methods and structures for stack type semiconductor packaging are disclosed. In one embodiment, a semiconductor device includes a semiconductor chip mounted onto a substrate, a first resin molding portion formed on the substrate for sealing the semiconductor chip, and a through metal mounted on the substrate so as to pierce the first resin molding portion around the semiconductor chip. The semiconductor device further comprises an upper metal electrically coupled with the through metal and mounted on the first resin molding portion to extend from the through metal toward the semiconductor chip along an upper surface of the first resin molding portion, where the through metal and the upper metal are formed into an integral structure.

20 Claims, 9 Drawing Sheets

(56) References Cited

FOREIGN PATENT DOCUMENTS

| JP | 2001244609 | 7/2001 |
| JP | 2002-134653 A | 5/2002 |
| JP | 2003-324116 | 11/2003 |
| JP | 2004-119863 A | 4/2004 |
| JP | 2004-158595 | 6/2004 |
| JP | 2004-342883 | 12/2004 |
| JP | 2005-317861 A | 10/2005 |

* cited by examiner

STRUCTURES AND METHODS FOR STACK TYPE SEMICONDUCTOR PACKAGING

CLAIM OF PRIORITY

This application claims priority from Japanese patent application 2007-116289 filed on Apr. 26, 2007.

FIELD OF TECHNOLOGY

The present invention relates to methods and structures for stack type semiconductor packaging.

BACKGROUND

Recently, semiconductor devices for portable electronic devices are being required to scale down as the portable electronic devices are getting ever smaller. Accordingly, the trend calls for more efficient packaging process for the semiconductor devices. A package-on-package (POP) process is one such packing process used to stack multiple ones of the semiconductor devices.

Figure 1A:
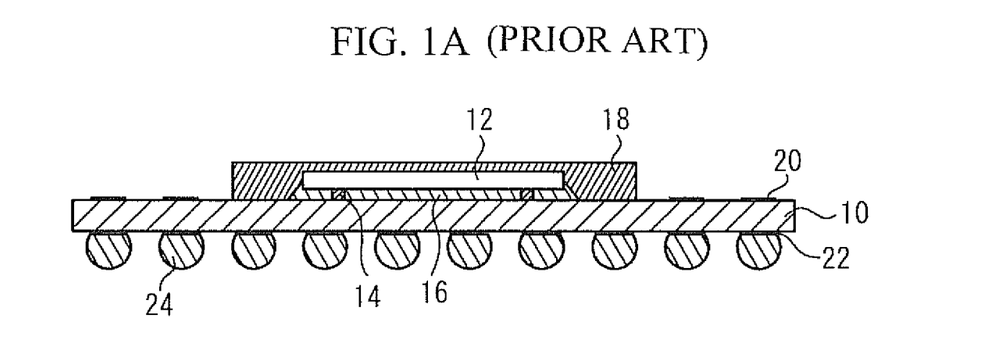
FIG. 1A is a cross-sectional view illustrating a conventional semiconductor device.

FIG. 1A is a cross-sectional view illustrating a conventional semiconductor device. In FIG. 1A, a semiconductor chip 12 is mounted face-down on a substrate 10 as an interconnection substrate through a flip chip connection using a bump 14. The semiconductor chip 12 is affixed to the substrate 10 with an underfill resin 16. The semiconductor chip 12 is sealed with a resin molding portion 18. Land electrodes 20 formed at the periphery of the semiconductor chip 12 are used to electrically couple the semiconductor device of FIG. 1 with another semiconductor device. Solder balls 24 are formed under the substrate 10. Each land electrode 20 and its respective solder ball 24 are electrically coupled. The solder ball 24 may be used as an electrode for installing the semiconductor device on a mother board, or as an electrode for stacking the semiconductor device to another semiconductor device.

Figure 1B:
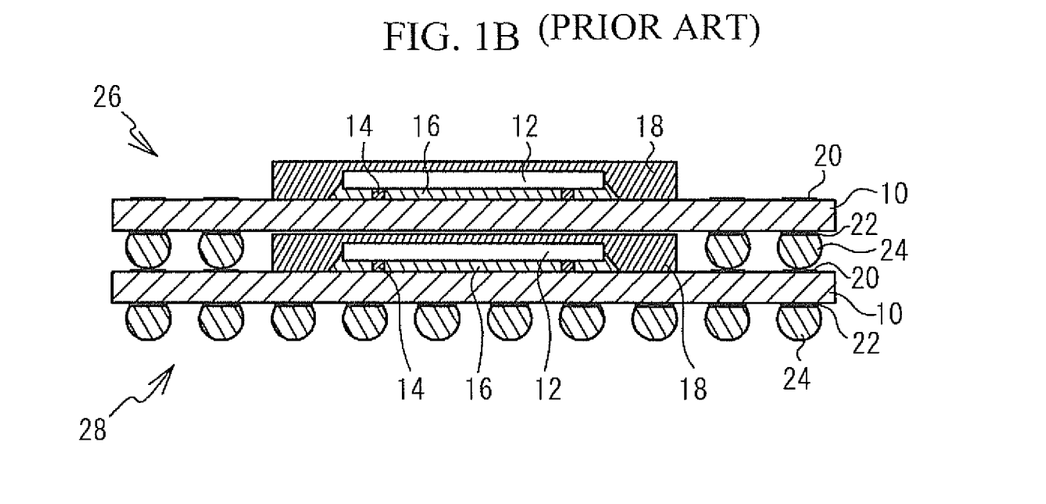
FIG. 1B is a cross-sectional view illustrating semiconductor devices stacked using the package-on-package process.

FIG. 1B is a cross-sectional view illustrating semiconductor devices stacked using the package-on-package process. In FIG. 1B, an upper semiconductor device 26 is stacked above a lower semiconductor device 28 using the solder balls 24. The packaging process illustrated in FIG. 1B requires extra real estate to form those solder balls 24 located at the periphery of the resin molding portion 18. In addition, the substrate 10 needs to be stretched to accommodate the solder balls 24 at the periphery, thus adding to the manufacturing cost and complicating the manufacturing process as a result.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

An embodiment described in the detailed description is directed to a semiconductor device which comprises a semiconductor chip mounted onto a substrate, a first resin molding portion formed on the substrate for sealing the semiconductor chip, and a through metal mounted on the substrate so as to pierce the first resin molding portion around the semiconductor chip. The semiconductor device further comprises an upper metal electrically coupled with the through metal and mounted on the first resin molding portion to extend from the through metal toward the semiconductor chip along an upper surface of the first resin molding portion, where the through metal and the upper metal are formed into an integral structure.

Another embodiment described in the detailed description is directed to a semiconductor device comprising a method for fabricating a semiconductor device. The method comprises mounting a semiconductor chip onto a substrate, forming a first resin molding portion on the substrate for sealing the semiconductor chip, forming on the substrate a through metal which pierces the first resin molding portion around the semiconductor chip, and forming on the first resin molding portion an upper metal which is electrically coupled with the through metal and which extends from the through metal toward the semiconductor chip along an upper surface of the first resin molding portion. According to the method, forming of the through metal is performed simultaneously with the forming of the upper metal so as to form an integral structure of the through metal and the upper metal.

As illustrated in the detailed description, other embodiments pertain to methods and structures that reduce size of the semiconductor device and simplify its manufacturing process. By implementing a fabrication process which allows placing solder balls below the substrate of the semiconductor device rather than at the periphery of the semiconductor device, the size of the semiconductor device can be significantly reduced.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments for stack type semiconductor packaging make it possible to significantly scale down the size of a stack type semiconductor device. By using a novel molding technique and packaging process, solder balls used to electrically connect two stacked semiconductor devices are formed such that they do not require any extra space in each of the semiconductor devices.

First Embodiment

Figure 2A:
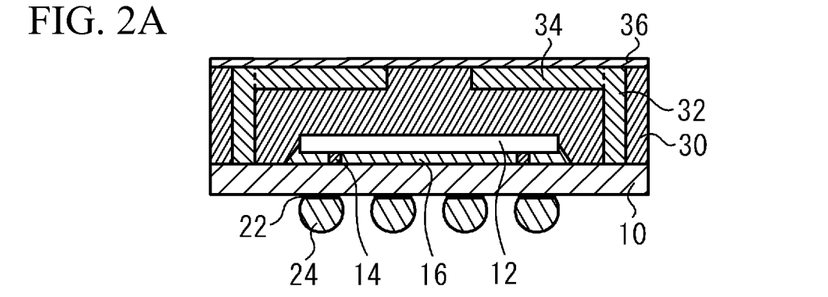
FIGS. 2A through 2C illustrate a semiconductor device according to a first embodiment seen from three different perspectives.
Figure 2B:
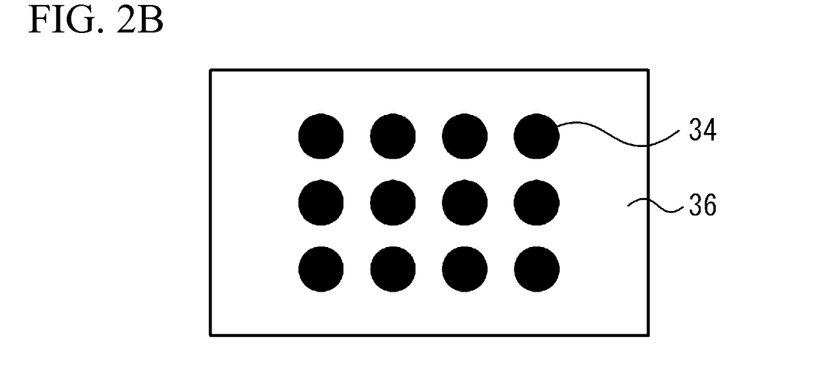
Figure 2C:
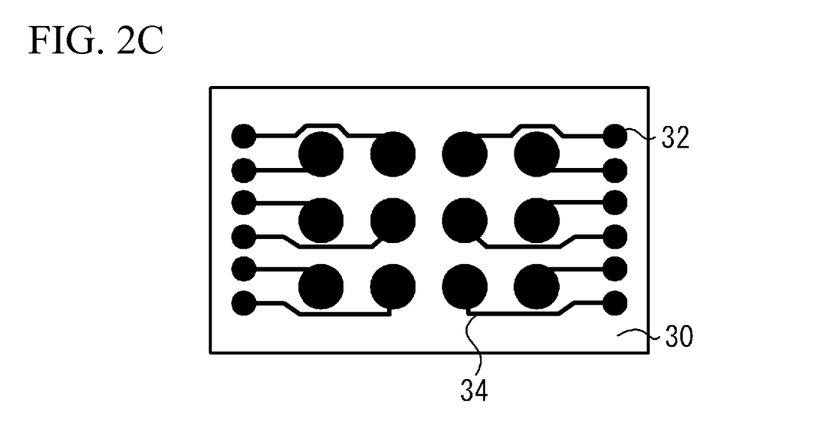

FIGS. 2A through 2C illustrate a semiconductor device according to a first embodiment seen from three different perspectives. FIG. 2A is a cross-sectional view of the semiconductor device, FIG. 2B is a top view of the semiconductor device, and FIG. 2C is a top view of the semiconductor device seen through a solder resist 36. In FIGS. 2A through 2C, the semiconductor chip 12 is packaged face down on the substrate 10 as an interconnection substrate with one or more bumps (e.g., the bump 14) in a flip chip connection. The semiconductor chip 12 is attached to the substrate 10 with the underfill resin 16. A first resin molding portion 30 is used to seal the semiconductor chip 12. A through metal 32 pierces the first resin molding portion 30 and surrounds the semiconductor chip 12. An upper metal 34 is electrically connected to the through metal 32 and extends toward a portion above the semiconductor chip 12 from the through metal 32. The upper metal 34 is embedded in the first resin molding portion 30. That is, the upper surface of the upper metal 34 forms a continuous surface with the upper surface of the first resin molding portion 30. The through metal 32 and the upper metal 34 are integrally formed with no joint surface. One or more solder balls (e.g., the solder ball 24) are attached under the substrate 10 via the land electrode 22. The solder ball 24 is electrically coupled with the through metal 32. A solder resist 36 is applied on the first resin molding portion 30, which has an opening through which a part of the upper metal 34 (e.g., the portion connected to the solder ball 24 of another semiconductor device stacked above the semiconductor device in FIG. 2A) is exposed.

Figure 3A:
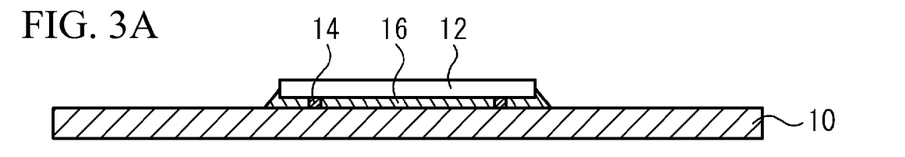
FIGS. 3A through 3D are cross-sectional views an exemplary process for manufacturing a semiconductor device, according to the first embodiment.

FIGS. 3A through 3D are cross-sectional views an exemplary process for manufacturing a semiconductor device, according to the first embodiment. In FIG. 3A, the semiconductor chip 12 is packaged face down on the substrate 10 in a flip chip connection using a bump (e.g., gold). An underfill resin 16 (e.g., epoxy resin) is applied between the semiconductor chip 12 and the substrate 10 to attach them.

Figure 3B:
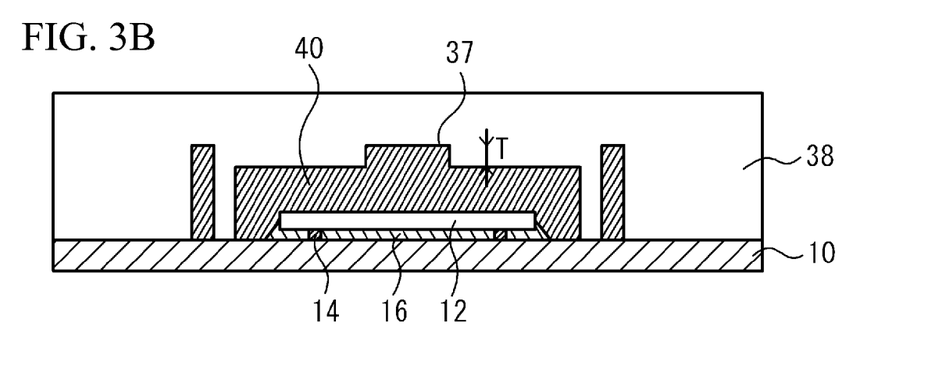

In FIG. 3B, a mold 38 with a mold portion 37 (recess portion) for molding the first resin molding portion 30 is formed on the substrate 10. It is appreciated that the first resin molding portion 30 is used for sealing the semiconductor chip 12. The mold portion 37 has a stepped portion T with the height ranging between 20 um and 100 um. The upper metal 34 is formed on the stepped portion. The first resin molding portion 30, which is the portion for forming the through metal 32, protrudes like a cylinder with the diameter of about 100 um. The mold 38 is heated to approximately 175° C., and a thermosetting epoxy resin 40 in an uncured state is fed to the mold portion 37 and then pressed. Through the process illustrated in FIG. 3B, a through hole 42 which pierces the first resin molding portion 30 surrounding the semiconductor chip 12 can be formed simultaneously with formation of the first resin molding portion 30.

Figure 3C:
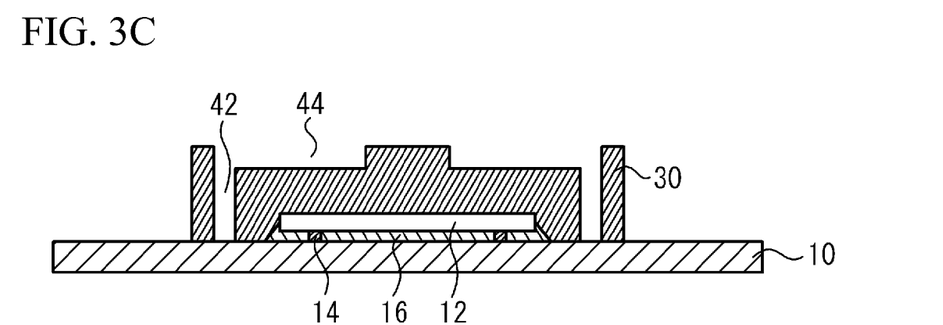
Figure 3D:
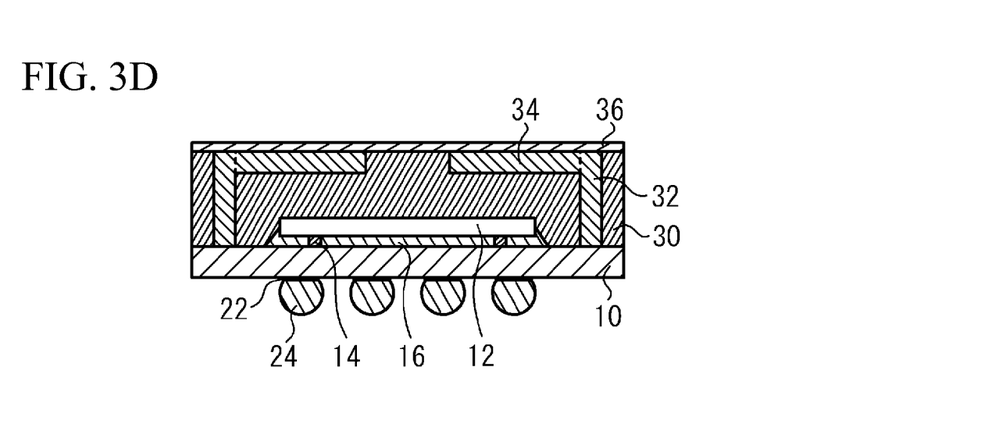

The mold 38 is removed as shown in FIG. 3C to provide the first resin molding portion 30 having through holes (e.g., the through hole 42) with the diameter of about 100 um. Notches (e.g., a notch 44), with the height ranging between 20 um and 100 um, extends above the semiconductor chip 12 from the through hole 42. In FIG. 3D, a copper (Cu) nano paste is squeegee printed on the first resin molding portion 30 to fill the through hole 42. As a result, the through metal 32 with the diameter of about 100 um is formed in the through hole 42, and the upper metal 34 with the height ranging between 20 um and 100 um is also formed in the notch 44. The solder resist 36 is further applied onto the first resin molding portion 30. One or more openings are formed on the solder resist 36, and the openings are used to connect with solder balls (e.g., the solder ball 24) of a semiconductor device stacked above the semiconductor in FIGS. 3A through 3D. The solder ball 24 is formed below the substrate 10 via the land electrode 22. The resultant substrate 10 is cut through a dicing process to provide the semiconductor device according to the first embodiment. The process illustrated in FIG. 3D makes it possible to easily form the through metal 32 and the upper metal 34 simultaneously, thus simplifying the manufacturing process of the semiconductor device.

Figure 4:
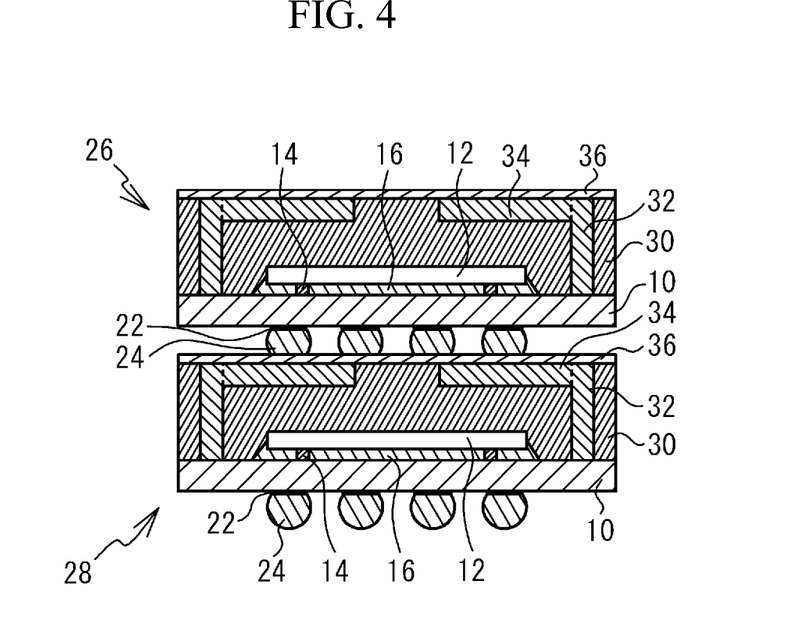
FIG. 4 is a cross-sectional view of exemplary semiconductor devices stacked using a package-on-package process, according to the first embodiment.

FIG. 4 is a cross-sectional view of exemplary semiconductor devices stacked using a package-on-package process, according to the first embodiment. In FIG. 4, the solder ball 24 of an upper semiconductor device 26 is connected to the upper metal 34 exposed through one or more openings formed on the solder resist 36 of a lower semiconductor device 28. The upper semiconductor device 26 and the lower semiconductor device 28 are stacked and electrically coupled. According one embodiment, as the upper metal 34 which is formed above the semiconductor chip 12 is confined within the first resin molding portion 30, the semiconductor devices may be stacked using the package-on-package process with their solder balls (e.g., the solder ball 24) formed below the first resin molding portion 30 in each device. Although FIG. 4 shows two stacked semiconductor devices, three or more semiconductor devices may be stacked.

It is appreciated that processes or structures illustrated in FIGS. 2A through 2C and 4 may simplify fabrication process of the semiconductor device(s) according to the first embodiment while allowing substantial downsizing of the semiconductor device(s).

Second Embodiment

Figure 5A:
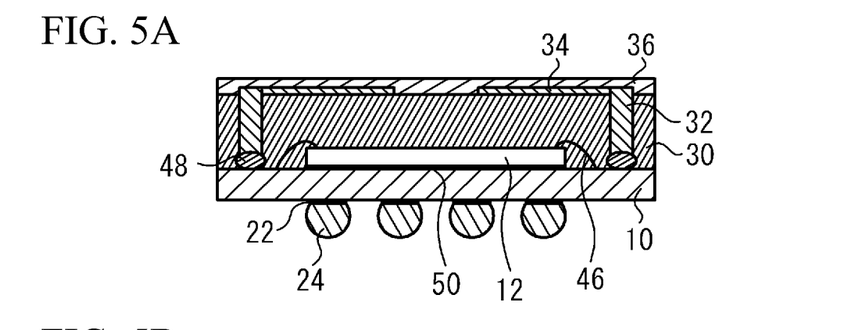
FIGS. 5A through 5C illustrate a semiconductor device according to a second embodiment seen from three different perspectives.
Figure 5B:
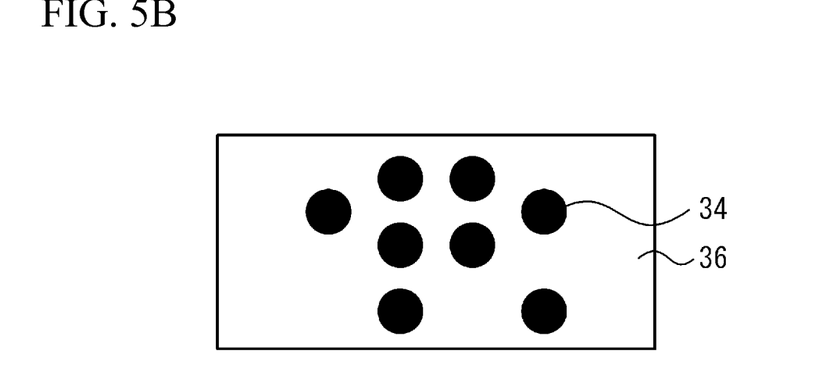
Figure 5C:
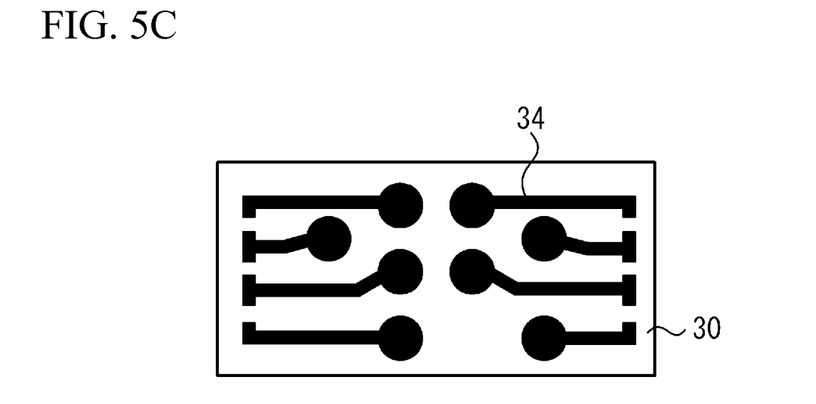

FIGS. 5A through 5C illustrate a semiconductor device according to a second embodiment seen from three different perspectives. FIG. 5A is a cross-sectional view of the semiconductor device, FIG. 5B is a top view of the semiconductor device, and FIG. 5C is a top view of the semiconductor device seen through the solder resist 36. In FIGS. 5A to 5C, the semiconductor chip 12 is mounted on the substrate 10 as an interconnection substrate using a die attaching material 50. The semiconductor chip 12 and the substrate 10 are electrically coupled through a wire 46. The through metal 32 is affixed to the substrate 10 with a conductive adhesive agent 48. It is appreciated that the rest of the semiconductor device in the figures are same as those of the first embodiment.

The method for manufacturing the semiconductor device according to the second embodiment will be described referring to FIGS. 6A through 8D. FIGS. 6A, 6B, 7A, 7B, 8A and 8B are cross-sectional views of a semiconductor device fabricated by an exemplary process according to the second embodiment. FIGS. 6C, 6D, 7C, 7D, 8C and 8D are top views of the semiconductor device fabricated by the exemplary process according to the second embodiment. It is appreciated that multiple semiconductor devices may be used in the process although only single semiconductor device is shown in FIGS. 6A through 8D.

Figure 6A:
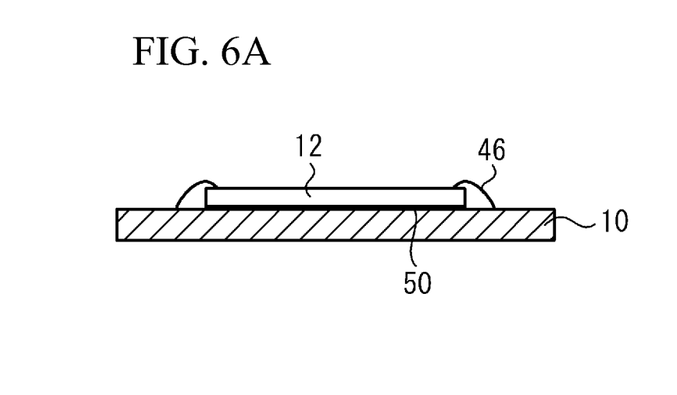
FIGS. 6A, 6B, 7A, 7B, 8A and 8B are cross-sectional views of a semiconductor device fabricated by an exemplary process according to the second embodiment
Figure 6B:
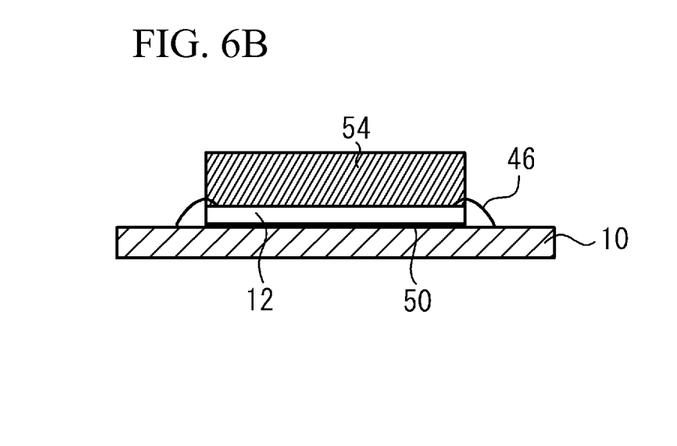
Figure 6C:
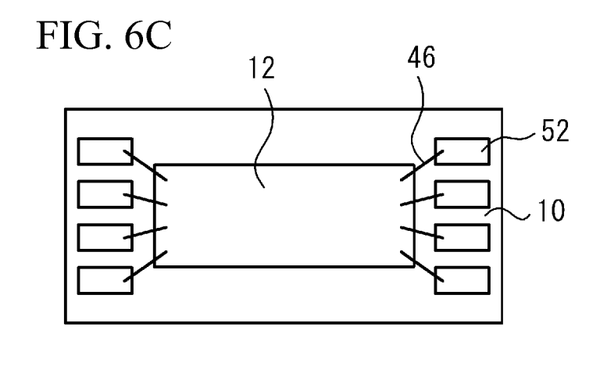
FIGS. 6C, 6D, 7C, 7D, 8C and 8D are top views of the semiconductor device fabricated by the exemplary process according to the second embodiment.
Figure 6D:
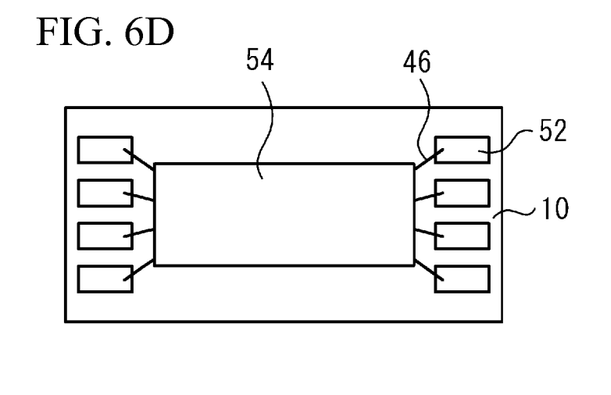

In FIGS. 6A and 6C, the semiconductor chip 12 is mounted on the substrate 10 as an interconnection substrate (e.g., glass epoxy) using the die attaching material 50. The semiconductor chip 12 is connected to leads 52 using the wire 46, where each lead forms a planar surface on the substrate 10. In FIGS. 6B and 6D, a second resin molding portion 54 (e.g., the epoxy resin) is formed on the semiconductor chip 12. The second resin molding portion 54 is used to adjust the height of the semiconductor device when a metal frame is mounted in a subsequent process as described below.

Figure 7A:
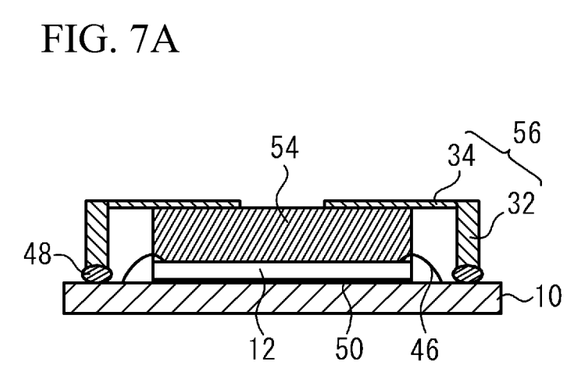
Figure 7B:
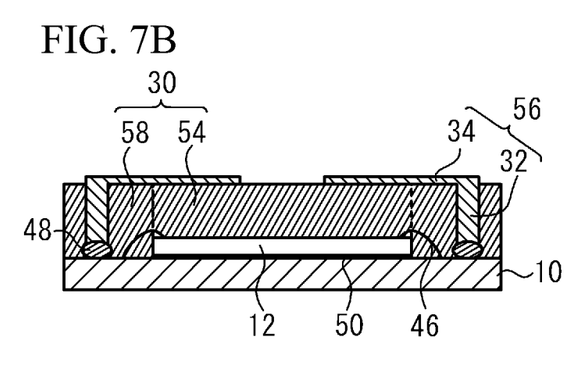
Figure 7C:
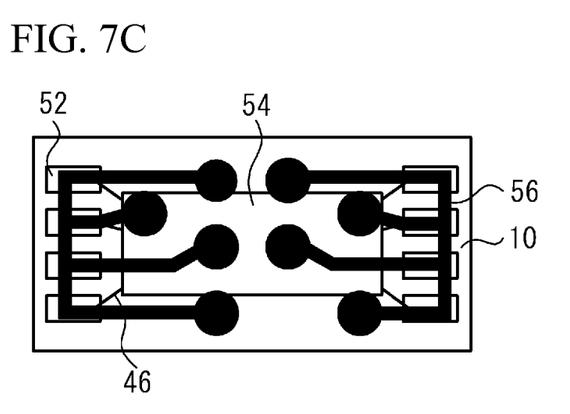

In FIGS. 7A and 7C, the metal frame 56 is formed by one or more of the through metals 32 and the upper metals 34. The metal frame 56 is in L-shape, where one or more pairs of the through metal 32 and the upper metal 34 are connected orthogonally. The distance from the substrate 10 to the second resin molding portion 54 is substantially same as the distance from the substrate 10 to the upper metal 34 portion of the metal frame 56. In one exemplary embodiment, the metal frame 56 is formed of copper (Cu). The metal frame 56 is mounted on the substrate 10 such that the through metal 32 is connected to the substrate 10, and the upper metal 34 is formed on the upper surface of the second resin molding portion 54. The through metal 32 may be connected to the substrate 10 using the conductive adhesive agent 48.

Figure 7D:
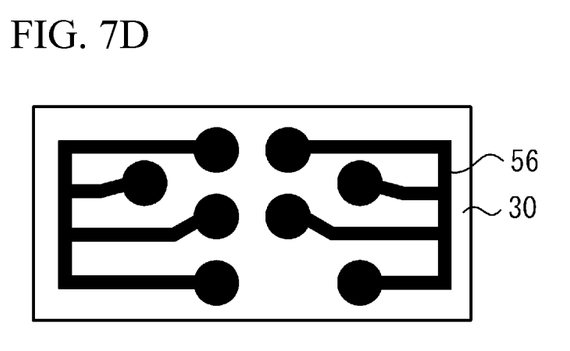

In FIGS. 7B and 7D, a third resin molding portion 58 is formed on the substrate 10 such that the upper metal 34 portion of the metal frame 56 is exposed. The first resin molding portion 30 which includes the second resin molding portion 54 and the third resin molding portion 58 is formed on the substrate 10, and the through metal 32 of the metal frame 56 pierces the first resin molding portion 30.

Figure 8A:
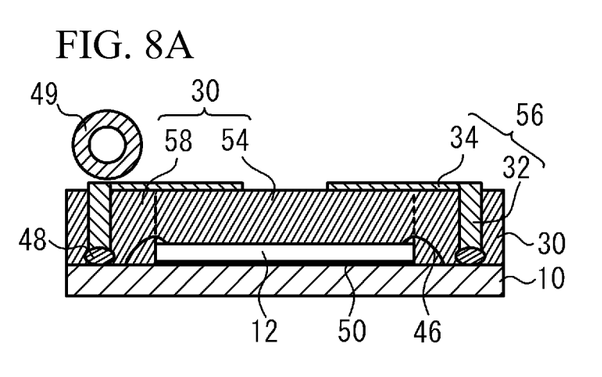
Figure 8B:
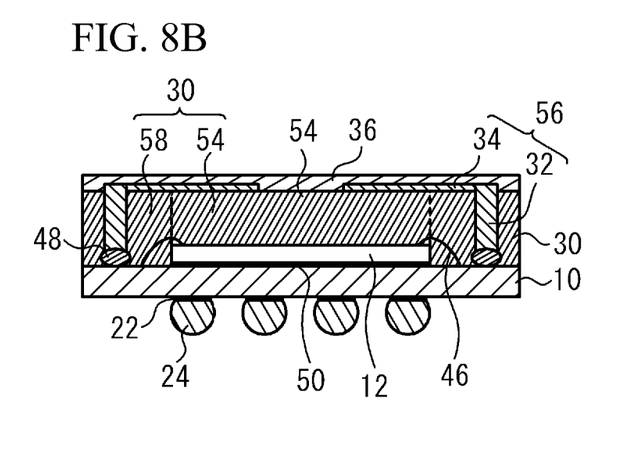
Figure 8C:
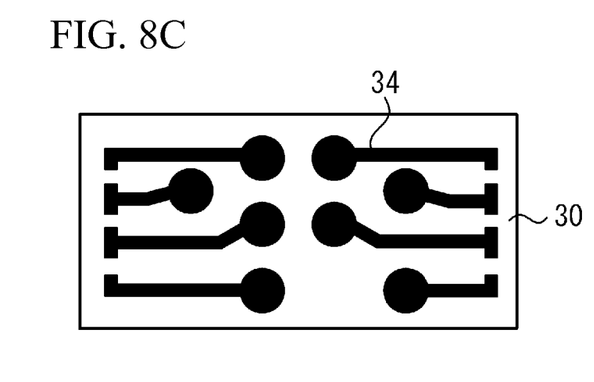

In FIGS. 8A and 8C, a dicing saw 49 (e.g., or a laser beam) is used to separate the upper metal 34 of the metal frame 56 from its adjacent upper metal 34. The metal frame 56 formed by multiple ones of the through metal 32 and their respective ones of the upper metal 34 is cut into multiple individual pairs of the through metal 32 and the upper metal 34.

Figure 8D:
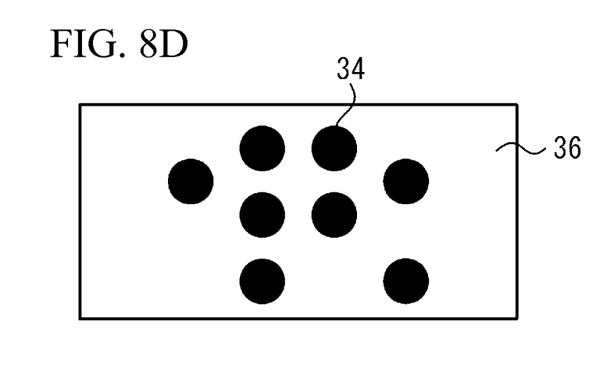

In FIGS. 8B and 8D, the solder resist 36 is applied onto the first resin molding portion 30. When the semiconductor devices are stacked, an opening is formed in the solder resist 36 above the upper metal 34 where one or more of the solder ball 24 of a semiconductor device stacked above can be connected with the one below. The solder ball 24 is formed on the substrate 10 via the land electrode 22.

Figure 9:
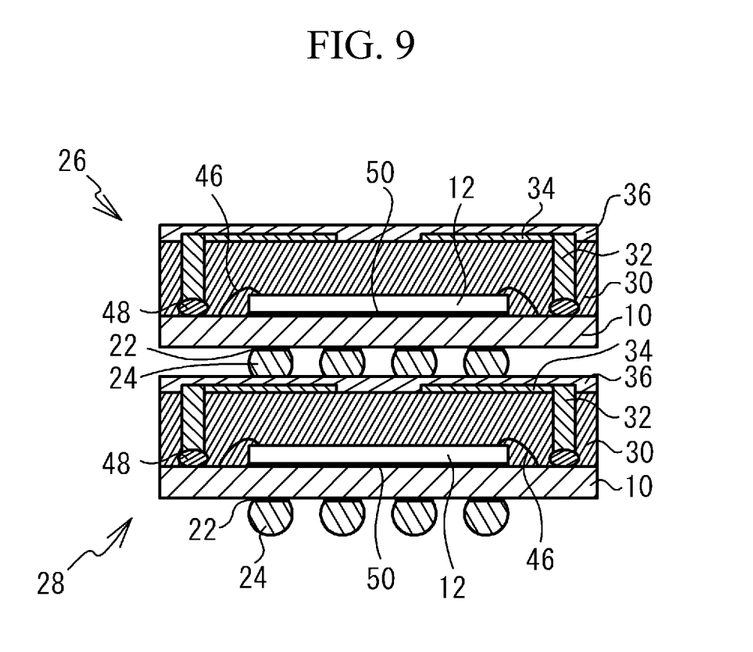
FIG. 9 is a cross-sectional view illustrating an exemplary process of stacking semiconductor devices using a package-on-package process, according to the second embodiment.

FIG. 9 is a cross-sectional view illustrating an exemplary process of stacking semiconductor devices using a package-on-package process, according to the second embodiment. In FIG. 9, the solder ball 24 of the upper semiconductor device 26 is connected (e.g., electrically coupled) to the upper metal 34 exposed through one or more openings formed in the solder resist 36 of the lower semiconductor device 28.

In one exemplary embodiment, the metal frame 56 is mounted on the substrate 10 to simultaneously form the through metal 32 which pierces the first resin molding portion 30 and the upper metal 34 which extends from the through metal 32, which is formed above the semiconductor chip 12, along the upper surface of the first resin molding portion 30. This may make it possible to easily manufacture the semiconductor device.

In one exemplary embodiment, the distance from the substrate 10 to the upper surface of the second resin molding portion 54 is substantially same as the distance from the substrate 10 to the upper metal 34 portion of the metal frame 56. It is appreciated that the second resin molding portion 54 can be used to adjust the height when the metal frame 56 is mounted. It is appreciated that the upper metal 34 of the metal frame 56 can be hidden rather than exposed. In one exemplary embodiment, an alternative material such as one plated with stannum (Sn) may be used for the metal frame 56. In one exemplary embodiment, a laser welding or other process along with the conductive adhesive agent 48 may be used to connect the through metal 32 to the substrate 10. It is appreciated that the face up packaging or the face down packaging may be used interchangeably in the flip chip connection of semiconductor devices.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A semiconductor device, comprising:
   a semiconductor chip mounted onto a substrate;
   a first resin molding portion formed on the substrate for sealing the semiconductor chip, the first resin molding portion comprising a plurality of notches and a corresponding plurality of through holes, the plurality of notches extending horizontally and substantially parallel to the surface of the substrate;
   a plurality of through metals mounted on respective through holes of the plurality of through holes, wherein a plurality of upper surfaces of the plurality of through metals is coplanar with an upper surface of the first resin molding portion; and
   a first plurality of upper metals electrically coupled with respective through metals of the plurality of through metals, the first plurality of upper metals comprising a first upper metal extending over a first portion of the semiconductor chip and a second upper metal extending over a second portion of the semiconductor chip, the first and second upper metals separated by a stepped portion of the first resin molding portion, wherein a plurality of upper surfaces of the first plurality of upper metals is coplanar with the plurality of upper surfaces of the plurality of through metals.

2. The semiconductor device according to claim 1, wherein each of the through metal and the upper metal is formed of a material which comprises copper.

3. The semiconductor device according to claim 1, wherein the semiconductor chip is packaged onto the substrate face down.

4. The semiconductor device according to claim 1, further comprising a plurality of land electrodes formed below the substrate.

5. The semiconductor device according to claim 4, further comprising a plurality of solder balls with each solder ball electrically coupled to the through metal via a respective one of the land electrodes.

6. The semiconductor device according to claim 1, further comprising a solder resist applied on the first resin molding portion.

7. The semiconductor device according to claim 6, wherein the solder resist comprises at least one opening through which the upper metal is exposed.

8. The semiconductor device according to claim 1, wherein the upper metal forms a contiguous surface with the upper surface of the first resin molding portion.

9. A method for packaging a semiconductor device, comprising:
    mounting a semiconductor chip onto a substrate;
    forming a first resin molding portion on the substrate for sealing the semiconductor chip, the first resin molding portion comprising a plurality of notches and a corresponding plurality of through holes formed simultaneously with the plurality of notches, the plurality of notches extending horizontally and substantially parallel to the surface of the substrate;
    forming on respective through holes of the plurality of through holes a plurality of through metals which pierces the first resin molding portion around the semiconductor chip, wherein a plurality of upper surfaces of the plurality of through metals is coplanar with an upper surface of the first resin molding portion; and
    forming on the first resin molding portion a first plurality of upper metals which is electrically coupled with corresponding through metals of the plurality of through metals, wherein the forming of the plurality of through metals is performed simultaneously with the forming of the first plurality of upper metals so as to form an integral structure of each through metal and each corresponding upper metal, wherein the first plurality of upper metals comprises a first upper metal extending over a first portion of the semiconductor chip and a second upper metal extending over a second portion of the semiconductor chip, the first and second upper metals separated by a stepped portion of the first resin molding portion,
    wherein forming the first plurality of upper metals comprises forming the first plurality of upper metals such that a plurality of upper surfaces of the first plurality of upper metals is coplanar with the plurality of upper surfaces of the plurality of through metals.

10. The method according to claim 9, wherein the forming of the first resin molding portion comprises forming a through hole which pierces the first resin molding portion around the semiconductor chip and forming a respective notch of the plurality of notches which extends from the through hole toward the semiconductor chip on an upper surface of the first resin molding portion.

11. The method according to claim 10, wherein the forming of the through metal comprises filling the through hole with a conductive material.

12. The method according to claim 10, wherein the forming of the upper metal comprises filling the notch with a conductive material.

13. The method according to claim 9, further comprising forming a solder resist above the upper metal, the through metal and the first resin molding portion, wherein the solder resist comprises at least one opening for connecting the upper metal to solder balls of another semiconductor device stacked above.

14. The method according to claim 9, further comprising forming a plurality of land electrodes formed below the substrate.

15. The method according to claim 14, further comprising forming a plurality of solder balls affixed to the land electrodes.

16. A method for packaging a semiconductor device, comprising:
    mounting a semiconductor chip onto a substrate;
    forming a first resin molding portion on the semiconductor chip;
    forming a metal frame made of a plurality of through metals connected to the substrate and a first plurality of corresponding upper metals formed on the first resin molding portion, wherein a plurality of upper surfaces of the plurality of through metals is coplanar with an upper surface of the first resin molding portion, and wherein the first plurality of corresponding upper metals comprises a first upper metal extending over a first portion of the semiconductor chip and a second upper metal extending over a second portion of the semiconductor chip, the first and second upper metals separated by a stepped portion of the first resin molding portion; and
    forming a second resin molding portion on the substrate surrounding the first molding portion, wherein the first resin molding portion and the second resin molding portion is formed such that an upper surface of the metal frame is exposed, and wherein a plurality of upper surfaces of the first plurality of upper metals is coplanar with plurality of upper surfaces of the plurality of through metals.

17. The method according to claim 16, further comprising forming a solder resist above the upper metal, the through metal, the first resin molding portion, and the second resin molding portion, wherein the solder resist comprises at least one opening for connecting the upper metal to solder balls of another semiconductor device stacked above.

18. The method according to claim 16, further comprising forming a plurality of land electrodes formed below the substrate.

19. The method according to claim 16, further comprising forming a plurality of solder balls affixed to the land electrodes.

20. The method according to claim 19, wherein the forming of the plurality of the solder balls is confined within the second resin molding portion.

* * * * *